(12) United States Patent
Dormitzer et al.

(10) Patent No.: US 6,873,195 B2
(45) Date of Patent: Mar. 29, 2005

(54) COMPENSATING FOR DIFFERENCES BETWEEN CLOCK SIGNALS

(75) Inventors: Paul Dormitzer, Acton, MA (US); Willem Engelse, Schiedam (NL); Raymond Robidoux, Windham, NH (US)

(73) Assignee: BigBand Networks BAS, Inc., Westborough, MA (US)

( * ) Notice: Subject to any disclaimer, the term of this patent is extended or adjusted under 35 U.S.C. 154(b) by 36 days.

(21) Appl. No.: 09/935,209

(22) Filed: Aug. 22, 2001

(65) Prior Publication Data

US 2003/0038660 A1 Feb. 27, 2003

(51) Int. Cl.⁷ .................................................. H03L 7/00
(52) U.S. Cl. ........................ 327/163; 327/162; 327/156; 375/354
(58) Field of Search ............................... 327/162, 163, 327/141, 145–147, 152–156, 250–253, 269–271, 144; 375/354–356, 362, 373, 375–377

(56) References Cited

U.S. PATENT DOCUMENTS

| | | | |
|---|---|---|---|
| 4,896,102 A | | 1/1990 | DuBois |
| 5,097,489 A | * | 3/1992 | Tucci .......................... 375/374 |
| 5,317,601 A | * | 5/1994 | Riordan et al. .............. 375/107 |
| 5,345,233 A | | 9/1994 | Nagata et al. |
| 5,574,671 A | | 11/1996 | Young et al. |
| 5,574,756 A | * | 11/1996 | Jeong .......................... 375/376 |
| 5,608,357 A | * | 3/1997 | Ta et al. ........................ 331/57 |
| 5,623,263 A | | 4/1997 | Kuo et al. |
| 5,642,386 A | * | 6/1997 | Rocco, Jr. .................... 375/355 |
| 5,645,711 A | | 7/1997 | Hraban et al. |
| 5,648,779 A | | 7/1997 | Cabler |
| 5,680,422 A | * | 10/1997 | Burch et al. ................ 375/371 |
| 5,982,831 A | * | 11/1999 | Chu ............................ 375/371 |
| 5,990,715 A | * | 11/1999 | Nishimura .................. 327/158 |
| 5,994,934 A | | 11/1999 | Yoshimura et al. |
| 6,005,904 A | * | 12/1999 | Knapp et al. ............... 375/376 |
| 6,041,090 A | * | 3/2000 | Chen ........................... 375/376 |
| 6,049,239 A | | 4/2000 | Eto et al. |
| 6,061,088 A | | 5/2000 | Khosravi et al. |
| 6,242,954 B1 | | 6/2001 | Taniguchi et al. |
| 6,262,611 B1 | * | 7/2001 | Takeuchi ..................... 327/159 |
| 6,275,020 B1 | | 8/2001 | Nagano |
| 6,307,906 B1 | * | 10/2001 | Tanji et al. .................. 375/376 |
| 6,313,676 B1 | | 11/2001 | Abe et al. |
| 6,323,705 B1 | * | 11/2001 | Shieh et al. ................. 327/158 |
| 6,373,911 B1 | * | 4/2002 | Tajima et al. ............... 375/375 |
| 6,415,006 B2 | * | 7/2002 | Rude ........................... 375/372 |
| 6,606,361 B1 | * | 8/2003 | Rowell ........................ 375/355 |
| 6,606,365 B1 | * | 8/2003 | Chen ........................... 375/376 |
| 6,639,956 B1 | * | 10/2003 | Song ........................... 375/354 |

* cited by examiner

*Primary Examiner*—Timothy P. Callahan
*Assistant Examiner*—Hal L. Nguyen
(74) *Attorney, Agent, or Firm*—Fogg & Associates, LLC; Laura A. Ryan

(57) ABSTRACT

A clock compensation circuit is provided. The circuit comprises a clock synchronization circuit coupled to receive an input clock signal, wherein the clock synchronization circuit generates a master clock signal and produces a plurality of internal logic clock signals. The circuit further comprises a phase comparator coupled to receive one of the plurality of internal logic clock signals and a sample clock from an associated receiver, wherein the phase comparator generates a control signal based on a phase comparison between the sample clock and the one of the plurality of internal logic clock signals and a down converter channel coupled to receive each of the plurality of internal logic clock signals and the control signal and to pass data in phase with the sample clock using the internal logic clock signal based on the control signal.

32 Claims, 3 Drawing Sheets

COMPENSATING FOR DIFFERENCES BETWEEN CLOCK SIGNALS

TECHNICAL FIELD

The present invention relates generally to the field of electronics and, in particular, to compensating for differences between clock signals.

BACKGROUND

Coaxial cable networks have been used to deliver high quality video programming to subscribers for many years. Conventionally, these networks have been unidirectional, broadcast networks with a limited number of channels and a limited variety of content provided to the subscribers. In recent years, cable companies have developed systems to provide bi-directional communication over their existing networks with a wider variety of services and content to their subscribers. For example, many cable companies now provide connection to the Internet through the use of cable modems.

The cable industry has developed a number of standards for delivering data over their networks to provide a uniform basis for the design and development of the equipment necessary to support these services. For example, a consortium of cable companies developed the Data Over Cable Service Interface Specifications (DOCSIS) standard. The DOCSIS standard specifies the necessary interfaces to allow for transparent, bi-directional transfer of Internet Protocol (IP) traffic between a cable head end and customer equipment over a cable or hybrid fiber/coax network.

A cable modem termination system (CMTS) is included in the head end of the cable network for processing the upstream and downstream transmission of data. In the upstream, the CMTS down converts the data signals to base band or a low intermediate frequency, then demodulates the signals. One problem with the design of the CMTS in many systems is in the complexity and expense of the down conversion circuitry. Typically, this down conversion is accomplished with a large number of analog components that impose requirements in space, expense, complexity, and time to implement and tune properly. To address some of these problems, digital down conversion circuits can be introduced in cable modem termination systems (CMTSs). Unfortunately, the use of digital down conversion circuits introduces substantial design complication. Specifically, when a digital down conversion circuit is used, it must interact with other circuits in the CMTS, including circuits on other chips and from other manufacturers. Each chip or circuit may have one or more independent time domains with various clock signals. Differences in the time domains introduced by these additional clock signals complicate the timing of the system.

For the reasons stated above, and for other reasons stated below which will become apparent to those skilled in the art upon reading and understanding the present specification, there is a need in the art for techniques for compensating for differences in clock signals from circuits that work together in a common system.

SUMMARY

The above mentioned problems with clock domains with the implementation of digital down conversion in communications systems and other problems are addressed by embodiments of the present invention and will be understood by reading and studying the following specification.

In one embodiment, a clock compensation circuit is provided. The circuit comprises a clock synchronization circuit coupled to receive an input clock signal, wherein the clock synchronization circuit generates a master clock signal and produces a plurality of internal logic clock signals. The circuit further comprises a phase comparator coupled to receive one of the plurality of internal logic clock signals and a sample clock from an associated receiver, wherein the phase comparator generates a control signal based on a phase comparison between the sample clock and the one of the plurality of internal logic clock signals and a down converter channel coupled to receive each of the plurality of internal logic clock signals and the control signal and to pass data in phase with the sample clock using the internal logic clock signal based on the control signal.

In another embodiment, a clock compensation circuit is provided. The circuit comprises an input for receiving an input clock signal, a clock synchronization circuit coupled to receive the input clock signal, wherein the clock synchronization circuit generates a master clock signal and produces a plurality of internal logic clock signals, and a tapped delay line coupled to receive a first one of the plurality of internal logic clock signals and to generate a clock signal with a selected delay as an output clock signal. In addition, the circuit includes a phase comparator coupled to receive a second one of the plurality of internal logic clock signals and a sample clock from an associated receiver and to generate a control signal based on a phase comparison of the second one of the plurality of internal logic clock signals and the sample clock, and a down converter channel coupled to receive the plurality of internal logic clock signals and the control signal and to pass data in phase with the sample clock using the second one of the plurality of internal logic clock signals based on the control signal.

In another embodiment, a method of generating a timing signal is provided. The method includes receiving an input clock signal, receiving a sample clock from an associated receiver and generating a master clock signal from the input clock signal. The method further includes generating a plurality of internal logic clock signals from the master clock signal and comparing the phase of one of the plurality of internal logic clock signals to the phase of the received sample clock. When the one of the plurality of internal logic clock signals is in phase with the received sample clock, selecting a data signal that is clocked on the rising edge of the one of the plurality of internal logic clock signals. When the one of the plurality of internal logic clock signals is out of phase with the received sample clock, selecting the data that is clocked on the falling edge of the one of the plurality of internal logic clock signals. Further, the method includes passing the selected data signal to the associated receiver.

In an alternate embodiment, a method of generating a timing signal is provided. The method includes receiving an input clock signal, receiving a sample clock from an associated receiver, and generating a master clock signal from the input clock signal. The method further includes generating a plurality of internal logic clock signals from the master clock signal, comparing the phase of one of the plurality of internal logic clock signals to the phase of the received sample clock, and generating a plurality of delayed clock signals from another one of the plurality of logic clock signals. Each of the plurality of delayed clock signals is synchronized with the sample clock of an associated receiver. When the one of the plurality of internal logic clock signals is in phase with the received sample clock, selecting a data signal that is clocked on the rising edge of the one of the plurality of internal logic clock signals. When the one of the plurality of internal logic clock signals is out of phase with the received sample clock, selecting the data that is clocked on the falling edge of the one of the plurality of internal logic clock signals. In addition, the method includes passing the selected data signal to the associated receiver.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide a mechanism for compensating for differences in clock signals between first and second circuits or chips. In one embodiment, the mechanism uses a tapped delay line to adjust for timing differences between the clock signals. Further, the mechanism compensates for phase differences between the clock signals by allowing data from one circuit to be clocked out to the other circuit on either a leading edge or a trailing edge of one of the clock signals based on a phase difference between the clock signals.

I. Clock Compensation

Figure 1:
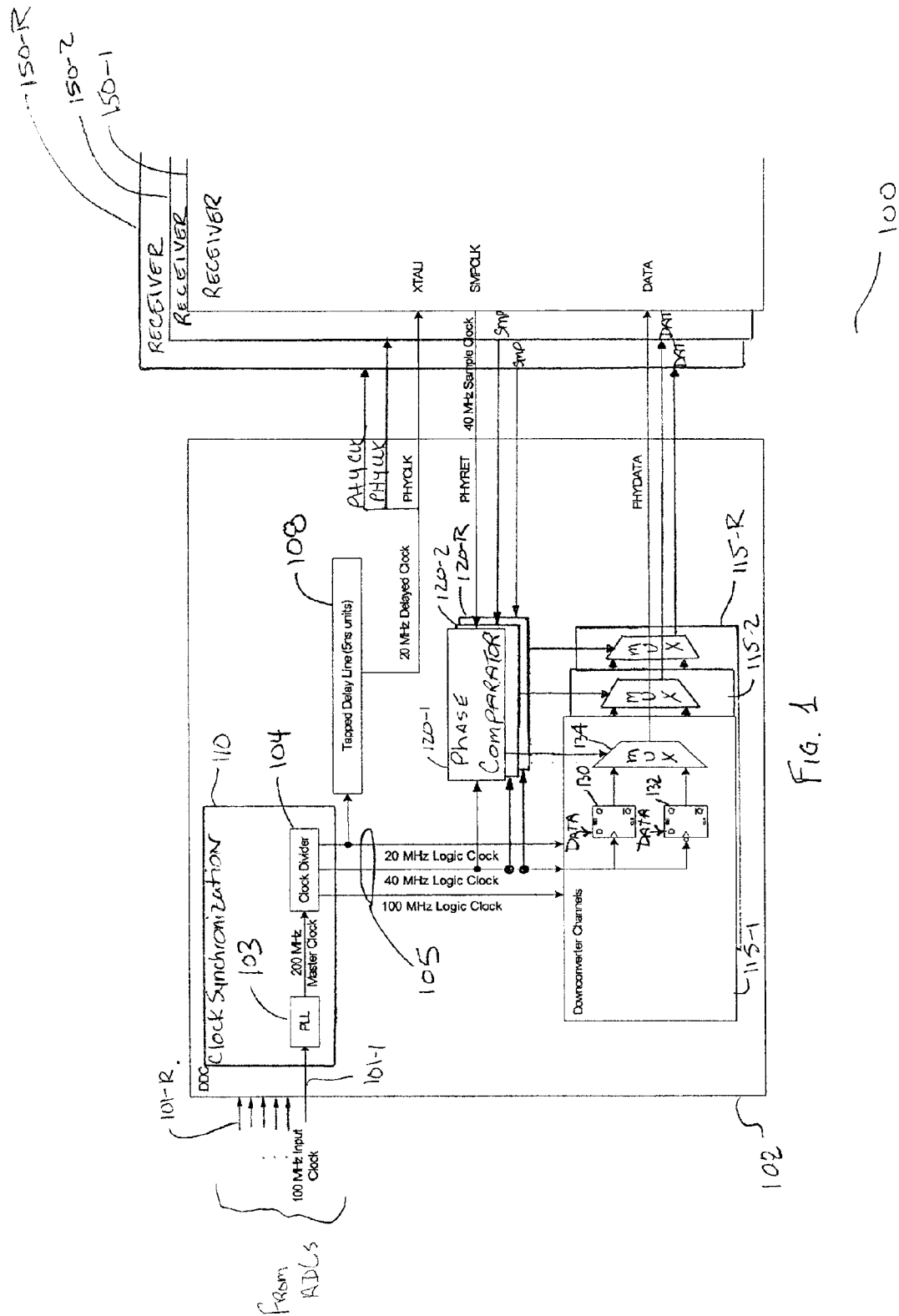
FIG. 1 is a block diagram of an embodiment of a communications system including a circuit that compensates for differences in clock signals according to the teachings of this invention.

FIG. 1 is a block diagram of an embodiment of a communications system, indicated generally at 100, including a circuit that compensates for differences in clock signals according to the teachings of this invention. In one embodiment, system 100 is a portion of an upstream circuit in a cable modem termination system (CMTS). Specifically, system 100 includes digital down converter 102 and a plurality of receivers 150-1 to 150-R. In one embodiment, receivers 150-1 to 150-R comprise BCM 3137 Universal Burst Receivers commercially available from Broadcom Corporation of Irvine, Calif. System 100 includes circuitry that compensates for differences between clock signals in digital down converter 102 and clock signals in receivers 150-1 to 150-R.

System 100 receives a plurality of input clock signals at 101-1 to 101-R. These clock signals are provided by R analog to digital converters. The data from each of the digital to analog converters is processed by a respective one of digital down converter channels 115-1 to 115-R as discussed in more detail below. In one embodiment, the input clock signals are on the order of 100 MHz clock signals.

System 100 uses one of the input clock signals at 101-1 to 101-R for generating internal clock signals for digital down converter 102. Digital down converter 102 includes clock synchronization circuit 110. Clock synchronizer 110 includes phase lock loop (PLL) 103 that is coupled to, for example, input 101-1. PLL 103 produces a master clock with a frequency of approximately 200 MHz that is locked to the input at 101-1. Clock synchronization circuit 110 further includes clock divider 104. Clock divider 104 produces a plurality of internal logic clock signals at 105. These internal logic clock signals include, in one embodiment, signals with frequencies on the order of 20, 40, and 100 MHz, respectively. In one embodiment, the internal logic clock signals have frequencies of approximately 20.48 MHz, 40.96 MHz, and 102.4 MHz, respectively. For simplicity in description, these signals are referred to as having frequencies of 20, 40 and 100 MHz.

System 100 generates a clock signal for an XTALI input of receivers 150-1 to 150-R with a selected delay based on one of the internal logic clock signals. In one embodiment, this clock signal is based on the 20 MHz internal logic clock signal although other internal logic clock signals are used in other embodiments. A Broadcom BCM 3137 Universal Burst Receiver typically receives a signal at the XTALI input from a crystal oscillator. From this clock, the BCM 3137 Universal Burst Receiver typically provides a sample clock to a digital to analog converter at output SMPCLK. In the embodiment of FIG. 1, however, the clock signal provided to the XTALI receivers 150-1 to 150-R is provided based on a clock signal at 101-1 to 101-R of digital down converter 102 from the digital to analog converters. This produces at least two problems addressed by system 100.

The first problem relates to the timing of the clock signals provided at the SMPCLK output by the receivers 150-1 to 150-R. Since there is a delay in the path of the receiver between the XTALI input and the SMPCLK output, the timing of the signal applied to the XTALI input is selectively controlled to allow the signal from SMPCLK to align in time with the internal logic clock signals of the digital down converter. This delay is programmed into digital down converter 102 based on experimental data and is implemented using tapped delay line 108. In one embodiment, tapped delay line 108 provides selected delay in units of 5 nanoseconds.

The second problem relates to the phase alignment of the signals in the receivers 150-1 to 150-R and the signals in digital down converter 102. This phase difference is compensated for by selectively clocking data out of a down converter channel 115-1 to 115-R based on either a leading edge or a trailing edge of the internal logic clock signal. The leading edge or the trailing edge is selected based on a phase comparison of signals from a respective one of the receivers 150-1 to 150-R and the internal logic clock signal. A phase comparator 120-1 to 120-R is associated with each down converter channel 115-1 to 115-R and an associated receiver 150-1 to 150-R, respectively. A separate phase comparison is made for each receiver 150-1 to 150-R by its associated phase comparator 120-1 to 120-R, respectively. A control signal is thus applied by each phase comparator 120-1 to 120-R to a respective down converter channel 115-1 to 115-R.

Down converter channels 115-1 to 115-R include circuitry that responds to its respective phase comparator to clock the data out on the correct phase of the internal logic clock signal. As each of the down converter channels is similar, only down converter channel 115-1 is described in detail.

Down converter channel 115-1 includes first and second flip flops 130 and 132. Each flip flop 130 and 132 receives the data for down converter channel 115-1 at its respective D input. Flip flop 130 is clocked on the leading edge of 40 MHz clock signal 105. Flip flop 132 is clocked on the trailing edge of 40 MHz clock signal 105. The output of both flip flops 130 and 132 is provided to multiplexer 134. Multiplexer 134 receives a control signal from its associated phase comparator 120-1. This control signal selects either the data clocked on the leading edge or the trailing edge of the internal logic clock signal 105. This data is phase aligned with clock signals in receiver 150-1.

Figure 2:
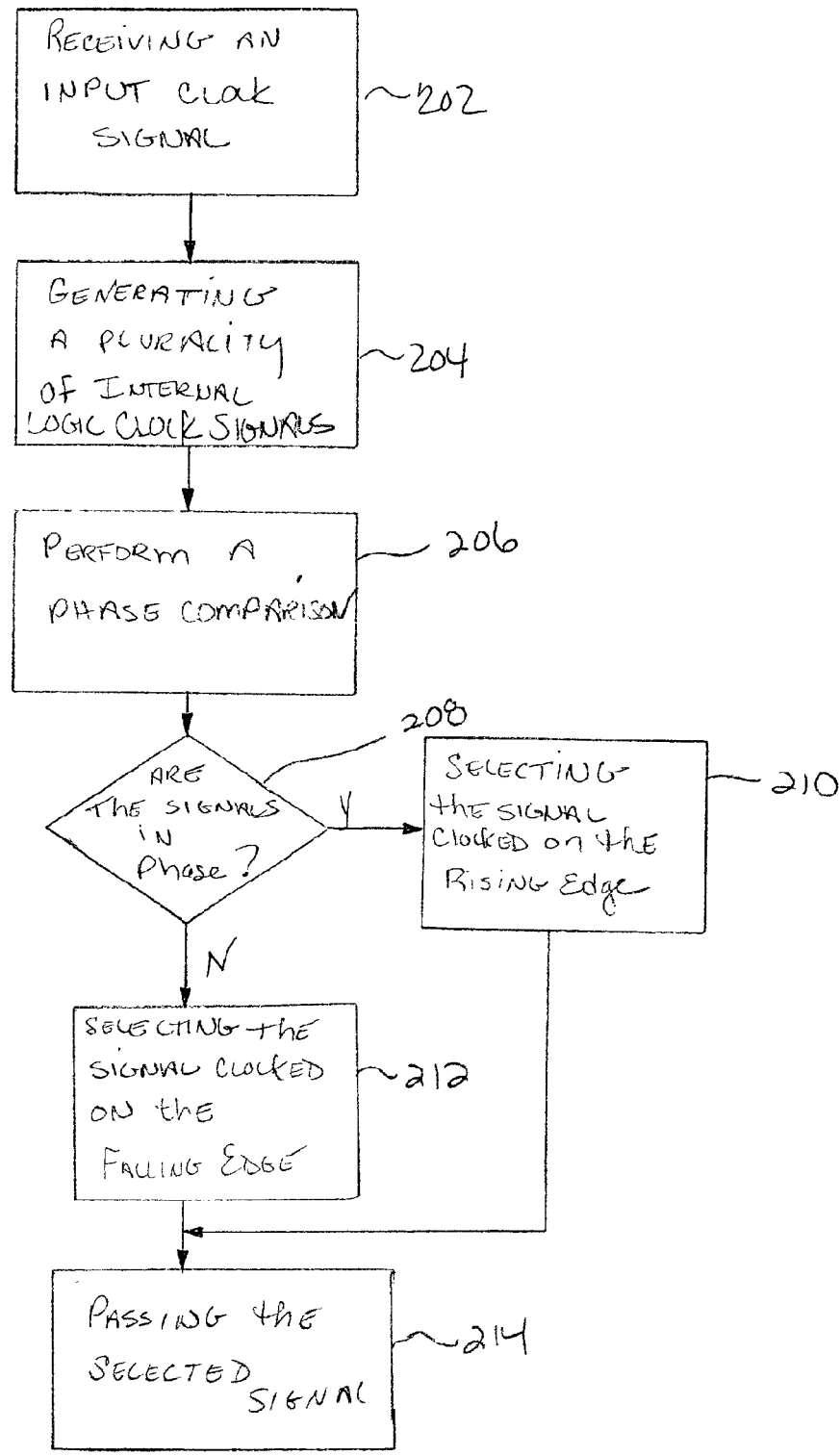
FIG. 2 is a flow chart of one embodiment of a method of compensating for differences in clock signals according to the teachings of this invention.

The operation of system 100 is described with respect to FIG. 2. This example is in terms of signals provided to receiver 150-1. It is understood that signals for other receivers are generated in a similar manner.

At block 202, digital down converter 102 receives an input clock signal. At block 204, clock synchronization circuit 110 generates a plurality of internal clock signals. At block 206, phase comparator 120-1 compares the phase of a signal from receiver 150-1 with the internal clock signal. At block 208, phase comparator 120-1 determines whether the signals are in phase. If the signals are in phase, phase comparator 120-1 provides a control signal to multiplexer 134 to select the data from flip flop 130 that is clocked on the rising edge of the internal logic clock signal. If, however, the signals are not in phase, phase comparator 120-1 generates a control signal that instructs multiplexer 134 to select the output of flip flop 132 that is clocked on the falling edge of the internal clock signal. At block 214, the selected data is passed to the receiver in phase with the clock signals of the receiver.

II. Digital Down Converter

Figure 3:
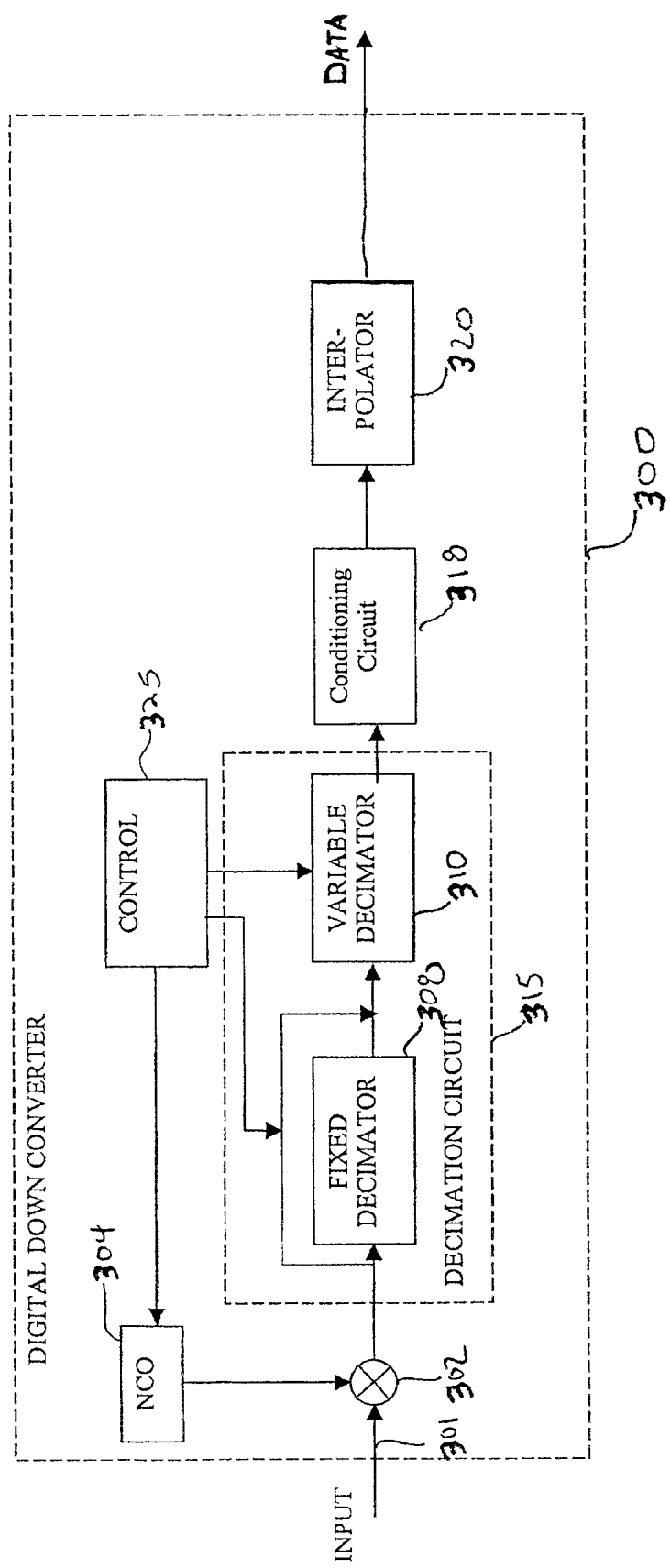
FIG. 3 is a block diagram of one embodiment of digital down converter according to the teachings of the present invention.

FIG. 3 is a block diagram of one embodiment of digital down converter, indicated generally at 300, according to the teachings of the present invention. In one embodiment, each of digital down converters 115-1 to 115-R of FIG. 1 are constructed as shown and described with respect to digital down converter 300 of FIG. 3.

Digital down converter 300 receives an input signal at input 301. Advantageously, digital down converter 300 is designed to accept signals at input 301 that comply with a number of standards, including but not limited to, the DOCSIS standard, the Euro-DOCSIS standard and other appropriate standards for providing data over a cable network. The initial down conversion is accomplished with a mixer circuit containing a mixer 302 and a numerically controlled oscillator 304. Mixer 302 mixes the input signal with an output of numerically controlled oscillator 304, which produces a down converted signal from the received input signal.

Digital down converter 300 further includes decimation circuit 315 that selectively decimates the down converted signal. Decimation circuit 315 reduces the sampling rate of the input signal down so as to reduce the burden and power consumption of the circuitry used to further process the signal. The decimation factor used in decimating the down converted signal is based on a characteristic of the input signal. In one embodiment, the decimation factor is based on the frequency band used for carrying data in the input signal. It is this ability to select the decimation factor that allows digital down converter 300 to be used with signals compliant with any of a number of different standards.

Decimation circuit 315 prepares the input signal for further processing. Signal conditioning circuit 318 is coupled to decimation circuit 315 to provide the further processing. In one embodiment, signal conditioning circuit 318 is a low pass filter. In another embodiment, signal conditioning circuit 318 is a finite impulse response low pass filter. In other embodiments, signal conditioning circuit 318 is any other appropriate circuit for conditioning the signal from decimation circuit 315.

In one embodiment, decimation circuit 315 accomplishes the selective decimation of the input signal using two main components. These components include a bypassable fixed decimator 308 and a variable decimator 310. In one embodiment, bypassable fixed decimator 308 is a 2:1 decimator and variable decimator 310 is variable between a 4:1 or 5:1 decimator. The decimation factors for bypassable fixed decimator 308 and variable decimator 310 are chosen based on the ratio of the number of samples per second of the input signal to a desired number of samples per second for signal conditioning circuit 318. For example, when the input signal is from a DOCSIS compliant system, the input signal is typically on the order of 100 Megasamples/second. In one embodiment, it is desired that the signal provided to signal conditioning circuit 318 be on the order of 20 Megasamples per second. Thus, in this case, the bypassable fixed decimator 308 is bypassed and the variable decimator is set to a 5:1 decimation factor. In the case of Euro-DOCSIS, the input signal typically comprises 200 Megasamples/second. Thus, to provide 20 Megasamples/second to signal conditioning circuit 318, decimation circuit 315 provides a 10:1 decimation factor. This is accomplished by not bypassing bypassable fixed decimation circuit 308 and providing a 5:1 decimation factor for variable decimator 310.

Signal conditioning circuit 318 is coupled to interpolator 320. Interpolator 320 increases the number of samples in the conditioned signal. In one embodiment, interpolator 320 is a 2:1 interpolator and increases the number of samples in the conditioned signal by a factor of 2.

Control circuit 325 controls the operation of various aspects of digital down converter 300. NCO 304 chooses the carrier frequency at which a channel is captured from the input signal based on control signals from control circuit 325. The carrier frequency is mixed with the input signals to take the desired upstream signals and cast them down to baseband. In one embodiment, baseband is 0 MHz. System 300 further includes a control circuit 325 coupled to NCO 304 and decimation circuit 315.

In one embodiment, for operation on a DOCSIS input signal received at 100 Megasamples/second, the fixed decimator 308 is selectably bypassed based on control signals received from control circuit 325. The input signal is then decimated by 5:1 in variable decimator 310 to obtain a decimated signal at 20 Megasamples/second. In this embodiment, the 20 Megasamples/second signal is filtered via a low pass filter (signal conditioning circuit 318) which rejects everything above 3.2 MHz. Once the signal has been filtered so that it does not have any undesirable signals or signal components the filtered signal is interpolated via interpolator 320.

In another embodiment, the input signal is received at 160 Megasamples/s and decimator 308 is selected and brings the signal down to 80 Megasamples/s. The variable decimator 310 receives the signal and is selected for 4:1 decimation and decimates the signal to a 20 Megasample/second signal. In one embodiment, the combination of a 2:1 selectable fixed decimator 308 and a variable 4:1 or 5:1 decimator 310 allows an input sampling rate of 100, 160, or 200 Megasamples/second. The use of a 160 Megasamples/second signal reduces the power usage of the digital down converter 300 and is still a high enough frequency to capture the entire EuroDOCSIS upstream band of 5–65 MHz.

In operation, digital down converter 300 receives an input signal and mixes the signal via mixer 302 with signals of NCO 304 the result is a digitally down converted signal. Mixer 302 and NCO 304 comprise a mixer circuit. The digitally downconverted signal is received by decimation circuit 315. Decimation circuit 315 decimates the output signal of mixer 302 based on control signals received from control circuit 325. The received control signals are based on the frequency of the input signal. The output of decimation circuit 315 is filtered in signal conditioning circuit 318 and interpolated in interpolator 320. The output of interpolator 320 is a data stream that is selectively passed to a receiver such as one of receivers 150-1 to 150-R of FIG. 1 through one of flip flops 130 and 132.

What is claimed is:
1. A clock compensation circuit, comprising:
  a clock synchronization circuit coupled to receive an input clock signal, wherein the clock synchronization circuit generates a master clock signal and produces a plurality of internal logic clock signals;

a phase comparator coupled to receive one of the plurality of internal logic clock signals and a sample clock from an associated receiver, wherein the phase comparator generates a control signal based on a phase comparison between the sample clock and the one of the plurality of internal logic clock signals; and a down converter channel coupled to receive each of the plurality of internal logic clock signals and the control signal and to pass data in phase with the sample clock using the one of the plurality of internal logic clock signals based on the control signal.

2. The clock compensation circuit of claim 1, wherein the clock synchronization circuit comprises:

a phase-locked loop coupled to receive the input clock signal and to generate the master clock signal; and a clock divider coupled to receive the master clock signal and to produce the plurality of internal logic clock signals.

3. The clock compensation circuit of claim 1, wherein the one of the plurality of internal logic clock signals is matched in frequency to the sample clock.

4. The clock compensation circuit of claim 1, wherein the synchronization circuit receives an input clock signal on the order of 100 MHz and produces internal logic clock signals on the order of 20 MHz, 40 MHz, and 100 MHz.

5. The clock compensation circuit of claim 1, wherein the down converter channel comprises:

a first flip flop circuit coupled to receive the one of the plurality of internal logic clock signals and to pass a first data signal with a first phase;

a second flip flop circuit coupled to receive the one of the plurality of internal logic clock signals and to pass a second data signal 180 degrees out of phase with the data signal output by the first flip flop; and a multiplexer coupled to receive the first and second data signals and the control signal, the multiplexer selectively outputting either the first data signal or the second data signal based on the control signal such that the data signal passed by the multiplexer is in phase with the sample clock signal.

6. The clock compensation circuit of claim 1, wherein the down converter channel produces two selectable outputs that are 180 degrees out of phase.

7. A digital down converter, comprising:

a clock compensation circuit including:

a clock synchronization circuit coupled to receive an input clock signal, wherein the clock synchronization circuit generates a master clock signal and produces a plurality of internal logic clock signals;

a phase comparator coupled to receive one of the plurality of internal logic clock signals and a sample clock from an associated receiver, wherein the phase comparator generates a control signal based on a phase comparison between the sample clock and the one of the plurality of internal logic clock signals; and a down converter channel coupled to receive each of the plurality of internal logic clock signals and the control signal and to pass data in phase with the sample clock using the one of the plurality of internal logic clock signals based on the control signal.

8. The digital down converter of claim 7, wherein the clock synchronization circuit comprises:

a phase-locked loop coupled to receive the input clock signal and to generate the master clock signal; and a clock divider coupled to receive the master clock signal and to produce the plurality of internal logic clock signals.

9. The digital down converter of claim 7, wherein the one of the plurality of internal logic clock signals is matched in frequency to the sample clock.

10. The digital down converter of claim 7, wherein the synchronization circuit receives an input clock signal on the order of 100 MHz and produces internal logic clock signals on the order of 20 MHz, 40 MHz, and 100 MHz.

11. The digital down converter of claim 7, wherein the down converter channel comprises:

a first flip flop circuit coupled to receive the one of the plurality of internal logic clock signals and to pass a first data signal with a first phase;

a second flip flop circuit coupled to receive the one of the plurality of internal logic clock signals and to pass a second data signal 180 degrees out of phase with the data signal output by the first flip flop; and a multiplexer coupled to receive the first and second data signals and the control signal, the multiplexer selectively outputting either the first data signal or the second data signal based on the control signal such that the data signal passed by the multiplexer is in phase with the sample clock signal.

12. A clock compensation circuit, comprising:

an input for receiving an input clock signal;

a clock synchronization circuit coupled to receive the input clock signal, wherein the clock synchronization circuit generates a master clock signal and produces a plurality of internal logic clock signals;

a tapped delay line coupled to receive a first one of the plurality of internal logic clock signals and to generate a clock signal with a selected delay as an output clock signal;

a phase comparator coupled to receive a second one of the plurality of internal logic clock signals and a sample clock from an associated receiver and to generate a control signal based on a phase comparison of the second one of the plurality of internal logic clock signals and the sample clock; and a down converter channel coupled to receive the plurality of internal logic clock signals and the control signal and to pass data in phase with the sample clock using the second one of the plurality of internal logic clock signals based on the control signal.

13. The clock compensation circuit of claim 12, wherein the clock synchronization circuit comprises:

a phase-locked loop coupled to receive the input clock signal and to generate the master clock signal; and a clock divider coupled to receive the master clock signal and to produce the plurality of internal logic clock signals.

14. The clock compensation circuit of claim 12, wherein the clock divider receives a master clock signal on the order of 200 MHz and produces internal logic clock signals on the order of 20 MHz, 40 MHz, and 100 MHz.

15. The clock compensation circuit of claim 12, wherein the second one of the plurality of internal logic clock signals is matched in frequency to the sample clock.

16. The clock compensation circuit of claim 12, wherein the down converter channel comprises:

a first flip flop circuit coupled to receive the second one of the plurality of internal logic clock signals and to pass a first data signal with a first phase;

a second flip flop circuit coupled to receive the second one of the plurality of internal logic clock signals and to pass a second data signal 180 degrees out of phase with the data signal output by the first flip flop; and a multiplexer coupled to receive the first and second data signals and the control signal, the multiplexer selectively outputting either the first data signal or the second data signal based on the control signal such that the data signal passed by the multiplexer is in phase with the sample clock signal.

17. A clock compensation circuit, comprising:

an input for receiving an input clock signal;

a clock synchronization circuit coupled to receive the input clock signal, wherein the clock synchronization circuit generates a master clock signal and produces a plurality of internal logic clock signals;

a phase comparator coupled to receive a first one of the plurality of internal logic clock signals and a sample clock from an associated receiver and to generate a control signal based on a phase comparison between the sample clock and the one of the plurality of internal logic clock signals;

a tapped delay line coupled to receive a second one of the plurality of internal logic clock signals and to generate a delayed clock signal for input to the associated receiver, wherein the delayed clock signal is synchronized with the sample clock; and a down converter channel coupled to receive the plurality of internal logic clock signals and the control signal and to pass data in phase with the sample clock using the first one of the plurality of internal logic clock signals based on the control signal.

18. The clock compensation circuit of claim 17, wherein the clock synchronization circuit comprises:

a phase-locked loop coupled to receive the input clock signal and to generate the master clock signal; and a clock divider coupled to receive the master clock signal and to produce the plurality of internal logic clock signals.

19. The clock compensation circuit of claim 17, wherein the first one of the plurality of internal logic clock signals is matched in frequency to the sample clock.

20. The clock compensation circuit of claim 17, wherein the down converter channel comprises:

a first flip flop circuit coupled to receive the first one of the plurality of internal logic clock signals and to pass a first data signal with a first phase;

a second flip flop circuit coupled to receive the first one of the plurality of internal logic clock signals and to pass a second data signal 180 degrees out of phase with the data signal output by the first flip flop circuit; and a multiplexer coupled to receive the first and second data signals and the control signal, the multiplexer selectively outputting either the first data signal or the second data signal based on the control signal such that the data signal passed by the multiplexer is in phase with the sample clock signal.

21. A communications system, comprising:

a plurality of receivers, wherein each receiver is coupled to receive a data signal and a clock signal;

a digital down conversion circuit, including:

a clock synchronization circuit coupled to receive an input clock signal, wherein the clock synchronization circuit generates a master clock signal and produces a plurality of internal logic clock signals;

a plurality of phase comparators, wherein each phase comparator is coupled to receive a first one of the plurality of internal logic clock signals and a sample clock signal from an associated one of the plurality of receivers and to generate a control signal based on a comparison of the phase of the first one of the plurality of internal logic clock signals with the sample clock signal; and a plurality of down converter channels, wherein each of the plurality of down converter channels is coupled to receive the plurality of internal logic clock signals and the control signal and passes data from the data signal in phase with the sample clock signal.

22. The communications system of claim 21, wherein the synchronization circuit comprises:

a phase-locked loop coupled to receive the input clock signal and to generate the master clock signal therefrom; and a clock divider coupled to receive the master clock signal and to produce the plurality of internal logic clock signals therefrom.

23. The communications system of claim 21, wherein each of the down converter channels comprises:

a first flip flop circuit coupled to receive the first one of the plurality of internal logic clock signals and to pass a first data signal with a first phase;

a second flip flop circuit coupled to receive the first one of the plurality of internal logic clock signals and to pass a second data signal 180 degrees out of phase with the data signal output by the first flip flop circuit; and a multiplexer coupled to receive the first and second data signals and the control signal, the multiplexer selectively outputting either the first data signal or the second data signal based on the control signal such that the data signal passed is in phase with the sample clock signal.

24. The communications system of claim 21, further comprising a tapped delay line coupled to receive a second one of the plurality of internal logic clock signals and to generate a plurality of output clock signals with a selected delay based on the second one of the plurality of internal logic clock signals, wherein each of the plurality of output clock signals is used by the associated receiver to generate the sample clock.

25. A method of generating a timing signal, the method comprising:

receiving an input clock signal;

receiving a sample clock from an associated receiver;

generating a master clock signal from the input clock signal;

generating a plurality of internal logic clock signals from the master clock signal;

comparing the phase of one of the plurality of internal logic clock signals to the phase of the received sample clock;

when the one of the plurality of internal logic clock signals is in phase with the received sample clock, selecting a data signal that is clocked on the rising edge of the one of the plurality of internal logic clock signals;

when the one of the plurality of internal logic clock signals is out of phase with the received sample clock, selecting the data that is clocked on the falling edge of the one of the plurality of internal logic clock signals; and passing the selected data signal to the associated receiver.

26. A method of generating a timing signal, comprising:

receiving an input clock signal;

receiving a sample clock from an associated receiver;

generating a master clock signal from the input clock signal;

generating a plurality of internal logic clock signals from the master clock signal;

comparing the phase of one of the plurality of internal logic clock signals to the phase of the received sample clock;

generating a plurality of delayed clock signals from another one of the plurality of logic clock signals, wherein each of the plurality of delayed clock signals is synchronized with the sample clock of an associated receiver;

when the one of the plurality of internal logic clock signals is in phase with the received sample clock, selecting a data signal that is clocked on the rising edge of the one of the plurality of internal logic clock signals;

when the one of the plurality of internal logic clock signals is out of phase with the received sample clock, selecting the data that is clocked on the falling edge of the one of the plurality of internal logic clock signals; and passing the selected data signal to the associated receiver.

27. A communications system, comprising:

a plurality of analog to digital converters;

a digital down converter coupled to receive an input clock signal from one of the plurality of analog to digital converters, wherein the digital down converter includes:

a clock synchronization circuit coupled to receive the input clock signal and to generate a master clock signal and a plurality of internal logic clock signals;

a plurality of phase comparators, wherein each phase comparator is coupled to receive a first one of the plurality of internal logic clock signals and a sample clock from an associated receiver, and wherein each phase comparator generates a control signal based on a phase comparison between the sample clock and the first one of the plurality of internal logic clock signals;

a plurality of down converter channels, wherein each down converter channel is coupled to receive each of the plurality of internal logic clock signals and the control signal and to pass data in phase with the sample clock using the first one of the plurality of internal logic clock signals based on the control signal;

a plurality of receivers, each receiver associated with one of the plurality of phase comparators and one of the plurality of down converter channels; and a tapped delay line coupled to a second one of the plurality of internal logic clock signals and to generate a clock signal with a selected delay as an output clock signal for each of the plurality of receivers.

28. The system of claim 27, wherein each of the plurality of down converter channels comprises:

a first flip flop circuit coupled to receiving the first one of the plurality of internal logic clock signals and to pass a first data signal with a first phase;

a second flip flop circuit coupled to receive the first one of the plurality of internal logic clock signals and to pass a second data signal 180 degrees out of phase with the data signal output by the first flip flop circuit; and a multiplexer coupled to receive the first and second data signals and the control signal, the multiplexer selectively outputting either the first data signal or the second data signal based on the control signal such that the data signal passed is in phase with the sample clock signal.

29. The system of claim 27, wherein each of the clock synchronization circuits comprises:

a phase-locked loop coupled to receive the input clock signal and to generate the master clock signal; and a clock divider coupled to receive the master clock signal and to produce the plurality of internal logic clock signals.

30. A clock compensation circuit, comprising:

a clock synchronization circuit coupled to receiving an input clock signal, wherein the clock synchronization circuit generates a plurality of internal logic clock signal of different frequencies;

a phase comparator coupled to receive at least one of the internal logic clock signal and a sample clock from an associated receiver, wherein the phase comparator generates a control signal based on a phase comparison between the sample clock and the at least one internal logic clock signal; and a down converter channel coupled to receive the at least one internal logic clock signal and the control signal and to pass data in phase with the sample clock using the internal logic clock signal based on the control signal.

31. A clock compensation circuit, comprising:

a phase comparator coupled to receive a first clock signal and a sample clock from an associated receiver, wherein the phase comparator generates a control signal based on a phase comparison between the sample clock and the first clock signal; and a data channel coupled to receive the first clock signal and the control signal and to pass data in phase with the sample clock using the first clock signal based on the control signal.

32. A clock compensation circuit, comprising:

a phase alignment circuit which includes:

a phase comparator coupled to receive a first clock signal and a sample clock from an associated receiver, wherein the phase comparator generates a control signal based on a phase comparison between the sample clock and the first clock signal; and a multiplexer to receive first and second data signals and the control signal, the multiplexer selectively outputting either the first data signal or the second data signal based on the control signal such that the data signal passed by the multiplexer is in phase with the sample clock signal.

* * * * *